United States Patent
Itabashi et al.

(10) Patent No.: US 6,797,112 B2
(45) Date of Patent: Sep. 28, 2004

(54) PLASMA TREATMENT APPARATUS AND METHOD OF PRODUCING SEMICONDUCTOR DEVICE USING THE APPARATUS

(75) Inventors: Naoshi Itabashi, Hachioji (JP); Naoyuki Kofuji, Tama (JP); Yasunori Goto, Kudamatsu (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 10/408,242

(22) Filed: Apr. 8, 2003

(65) Prior Publication Data

US 2003/0203641 A1 Oct. 30, 2003

Related U.S. Application Data

(63) Continuation of application No. 09/944,376, filed on Sep. 4, 2001, now abandoned.

(30) Foreign Application Priority Data

Mar. 19, 2001 (JP) ........................................ 2001-077423

(51) Int. Cl.[7] ............................ H05H 1/00; C23C 16/00
(52) U.S. Cl. ........................... 156/345.41; 118/723 MW
(58) Field of Search ..................... 156/345.41, 345.42; 118/723 MW, 723 ME, 723 MR, 723 MA, 719; 315/111.21, 111.41, 111.71

(56) References Cited

U.S. PATENT DOCUMENTS

| | | | |
|---|---|---|---|
| 5,520,771 A | 5/1996 | Kanai et al. | ............ 156/345.41 |
| 6,143,081 A | 11/2000 | Shinriki et al. | ............. 118/719 |

FOREIGN PATENT DOCUMENTS

| JP | 3-68771 | 3/1991 |
|---|---|---|
| JP | 10-134995 | 5/1998 |
| JP | 10-199699 | 7/1998 |
| JP | 11-111696 | 4/1999 |
| JP | 11-354502 | 12/1999 |
| JP | 2000-77384 | 3/2000 |
| JP | 2000-164392 | 6/2000 |
| JP | 2000-223298 | 8/2000 |
| JP | 2000-268994 | 9/2000 |
| JP | 2000-357683 | 12/2000 |

Primary Examiner—Parviz Hassanzadeh
(74) Attorney, Agent, or Firm—Miles & Stockbridge P.C.

(57) ABSTRACT

A plasma treatment apparatus which introduces electromagnetic waves from a dielectric window into a chamber evacuated to low pressure has a standing wave controlling part provided near the periphery part of the dielectric window with the portions other than the entrance thereof being surrounded by conductor, and having shape and size thereof equivalent to depth $d=l/4+l/2 \times (n-1) \pm l/8$: (n=positive integer, $l=c$(light velocity)$/f/\sqrt{\epsilon}$) in terms of the characteristic length.

7 Claims, 12 Drawing Sheets $d = \ell/4 + \ell/2 \times (n-1) \pm \ell/8$ :
(n=POSITIVE INTEGER, $\ell$ =c(LIGHT VELOCITY )/f/$\sqrt{\varepsilon}$ )

FIG. 2
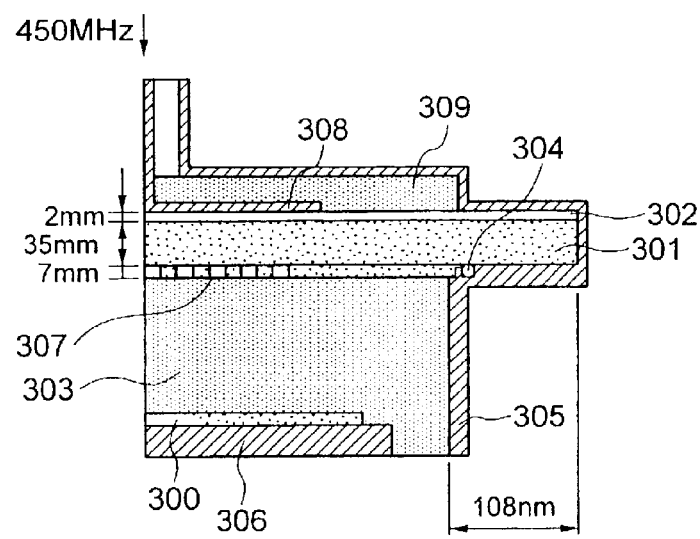
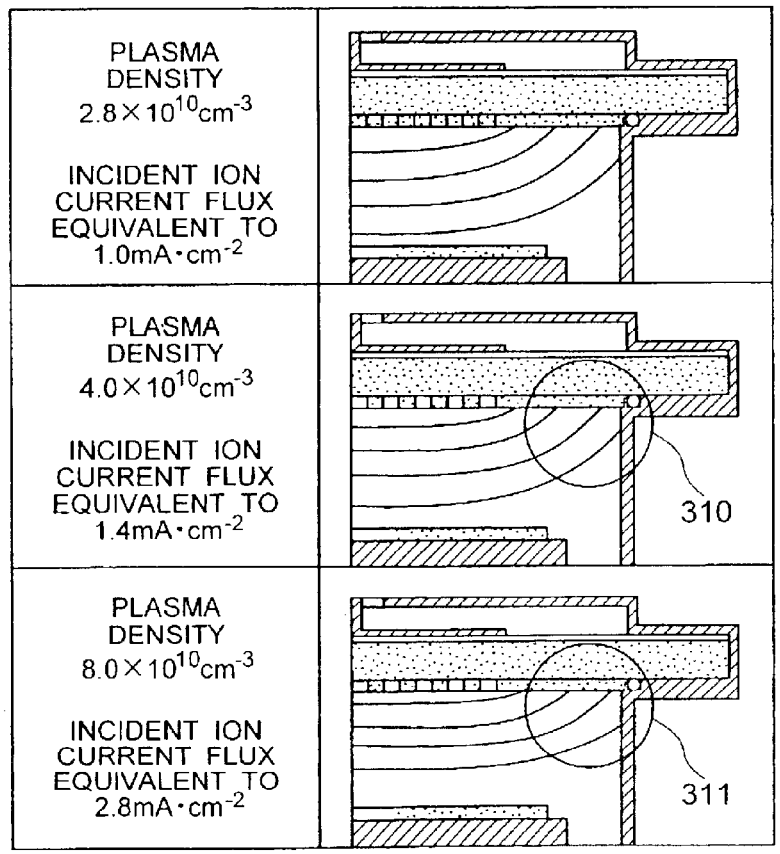
FIG. 3A
FIG. 3B
FIG. 3C

FIG. 4A
FIG. 4B
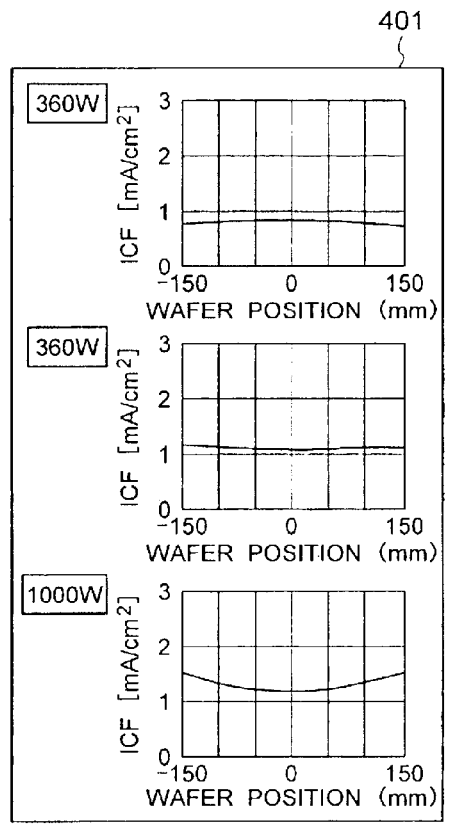
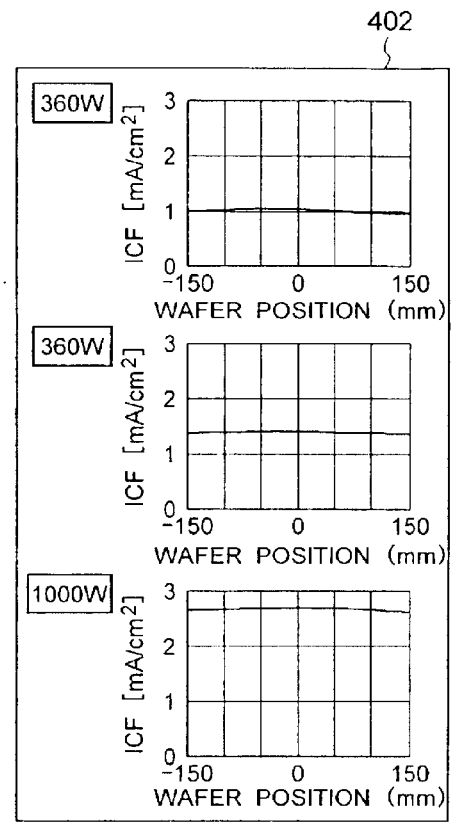
FIG. 4C
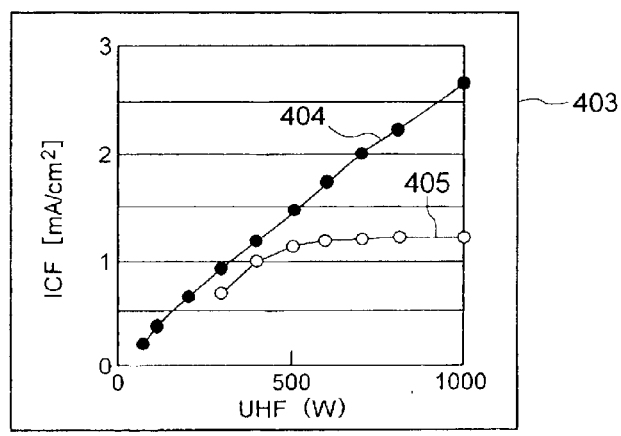

PLASMA TREATMENT APPARATUS AND METHOD OF PRODUCING SEMICONDUCTOR DEVICE USING THE APPARATUS

CROSS-REFERENCE TO RELATED APPLICATION

This application is a continuation of application Ser. No. 09/944,376 filed Sep. 4, 2001 now abandoned.

BACKGROUND OF THE INVENTION

The present invention relates to plasma treatment technology for making a source gas into a plasma and carrying out treatments such as etching, ashing, film deposition, and sputtering etc. on a surface of a solid material such as a semiconductor with physical or chemical mutual reaction of activated particles. In particular, the present invention relates to a plasma treatment apparatus effective for etching a gate or metal during the course of manufacturing a semiconductor device (semiconductor integrated circuit device).

RELATED ART

Conventionally, with regard to a plasma treatment apparatus, for the purpose of improving uniformity or stability of plasma for treatment on the surface of a semiconductor material, the following constructions are known.

(a) A plasma treatment apparatus which comprises a dielectric window for introduction of electromagnetic waves into a chamber evacuated to low pressure, and for which size and shape of an opening of dielectric window to the side of the chamber evacuated to low pressure, that is, size and shape of the chamber evacuated to low pressure immediately below the dielectric window is stipulated.

For example, JP-A-11-111696 specification discloses the relationship between size and shape of an opening of a rectangular dielectric window to the side of the chamber evacuated to low pressure and frequency of electromagnetic waves. In addition, JP-A-10-199699 specification discloses the relationship between size and shape of an opening of a circular dielectric window to the side of the chamber evacuated to low pressure and frequency of electromagnetic wave.

(b) A plasma treatment apparatus which comprises a dielectric window for introduction of electromagnetic wave into inside a chamber evacuated to low pressure and an antenna of a disk type, a ring type, and a slot type etc. toward the atmosphere side of the dielectric window, and for which size and shape of the antenna is stipulated.

For example, JP-A-2000-164392 specification discloses the relationship between size and shape of an antenna of a ring type comprised in the atmosphere side of the dielectric window and frequency of electro-magnetic wave. In addition, JP-A-2000-223298 specification discloses the relationship between size and shape of an antenna of a slot type comprised in the atmosphere side of the dielectric window and frequency of electromagnetic wave.

In addition, JP-A-2000-77384 specification, for example, discloses a plasma treatment apparatus related to both of the above described (a) and (b), and control of uniformity of plasma by way of ratio of size and shape of an antenna of a circular type comprised in the atmosphere side of the dielectric window to size and shape of an opening of a circular dielectric window to the side of the chamber evacuated to low pressure.

(c) A plasma treatment method which comprises inside a chamber evacuated to low pressure an antenna for introduction of electromagnetic wave into inside the chamber evacuated to low pressure, and for which size and shape of the antenna is stipulated. For example, JP-A-2000-268994 specification discloses the relationship between size and shape of an antenna comprised inside a chamber evacuated to low pressure and frequency of electromagnetic wave. In addition, JP-A-10-134995 specification discloses the relationship between size and shape of an antenna comprised inside a chamber evacuated to low pressure, which includes the case where walls of a chamber evacuated to low pressure are regarded as a part of an antenna and frequency of electromagnetic wave.

(d) A plasma treatment apparatus for which size and shape of a periphery part of a dielectric window for introduction of electromagnetic wave into inside a chamber evacuated to low pressure or structure and material quality thereof is stipulated.

For example, JP-A-3-68771 specification discloses a plasma treatment apparatus in which a microwave absorber is caused to be equipped in the final end of a microwave transmission line.

Moreover, JP-A-11-354502 specification, for example, discloses a plasma treatment apparatus related to both of the above described (c) and (d), and relationship between the end of the antenna and shape/size of a grounding part with respect to function of the periphery part of the antenna comprised inside the chamber evacuated to low pressure. In addition, JP-A-2000-357683 specification discloses relationship between the end of the antenna and shape/size of a electromagnetic wave corrector made of metal or dielectric with respect to function of the periphery part of the antenna comprised inside the chamber evacuated to low pressure.

In recent years, improvement in uniform treatment performance inside semiconductor wafers with large diameter (300 mmϕ or more) is demanded in plasma treatment utilized for manufacturing semiconductor integrated circuit apparatus, so-called LSI (Large Scale Integrated Circuit). In addition, a wide range of application to the following processing steps in an LSI manufacturing process are demanded.

(1) An application to an etching step that can go with micronization with high anisotropy and selectivity, targeting processing of a gate electrode, a metal film or an insulating film.

(2) An application to an anti-reflective film processing step such as BARC (Bottom Anti-Reflective Coating) etc. prior to the above described etching step and a processing step of a hard mask made of film oxide or film nitride etc.

(3) An application to a trimming step for controlling size of a mask prior to the above described etching step.

(4) An application to a step of processing a trench for device split or a gate side wall spacer that is regarded to require a wide range of controllability on such as angle or shape or roundness, etc.

(5) An application to film deposition step that is regarded to require a wide range of condition setting such as pressure range etc.

(6) An application to a step (post-treatment step) to remove resist and etching remains (etching residue) as well as damage layer after etching treatment.

(7) An application to sputtering.

In particular, just the etching step (etching step including primary gate processing as well as before and after that processing) related to forming of a gate of an MOS transistor may include a lot of steps covering the above described trench processing, anti-reflective film processing, mask processing, processing of making a trimmed mask accompanied hereby, processing of the gate itself, and spacer processing thereafter and an apparatus that has all-round ability enabling to carry out all of them is being demanded.

In addition, due to recent demand for small-amount multi-species production, and also from necessity of application to an LSI such as a system LSI in which a plurality of device structures are mounted in a mixed fashion on the same wafer, extremely highly uniform plasma generation is regarded necessary for processing a wafer with large diameter within a wide condition ranges of 0.1 Pa to 10 Pa in terms of processing pressure, 0.3 to 3 mA/cm$^2$ in terms of ion incident current flux to a wafer with respect to various gas seeds.

The present inventors identified the problems with the existing plasma treatment apparatus in the course of developing the present invention. Those problems will be described below with reference to FIG. 17 and FIG. 18, although those figures pertain to an apparatus considered by the inventors in the course of developing the present invention.

FIG. 17 is a schematic view of a plasma treatment apparatus that the inventors considered. This plasma treatment apparatus comprises a chamber evacuated to low pressure (chamber) 206 shaped as a cylinder on which an object for processing, such as a wafer 200, is disposed. FIG. 17 shows a right half sectional view in the radius direction from the center to the outer periphery of this chamber 206.

According to this plasma treatment apparatus, a dielectric window consisting of a quartz plate 202 and a quartz shower plate 203 is provided in a position facing a wafer stage 201 inside the chamber evacuated to low pressure 206. In addition, the quartz plate 202 and the quartz shower plate 203 are fixed to the chamber evacuated to low pressure 206 with a vacuum seal material 204. In order to generate plasma 205, a gas is introduced into inside the chamber evacuated to low pressure 206, and as for frequency of a high-frequency power source to generate electromagnetic waves for making this gas into plasma, 450 MHz was used. The radius of the quartz glass is designed larger than the radius of the internal wall surface of the chamber evacuated to low pressure 206 by around 23 mm. Here, 23 mm is a size falling outside a range of characteristic length of $d=l/4+l/2\times(n-1) \pm l/8$: (n: a positive integer, $l=c$(light velocity)$/f/\sqrt{\epsilon}$, $\epsilon$:dielectric constant. A gap 207 with a thin air layer is provided on the rear face of the quartz plate 202. An antenna 208 and an antenna spacer 209 made of alumina ($Al_2O_3$) are provided near the upper part of the quartz plate 202.

An electric field distribution inside the chamber 206 is shown in FIG. 18. This electric field distribution has been obtained by calculation.

(a) For a plasma density being not more than $2.8\times10^{10}$ cm$^{-3}$ (equivalent to 1.0 mA/cm$^2$ in terms of incident ion current flux (ICF)), a portion with an intense electric field appears in a region slightly being biased to the center part of the space located above the wafer stage. The plasma is initially generated in this intense electric field portion, and that plasma spreads outward due to diffusion so that a uniform ion current is incident onto a wafer. However, as the plasma density is made to increase to (b) $4.0\times10$ cm$^{-3}$ (equivalent to 1.4 mA/cm$^2$ in terms of ICF), or (c) $8.0\times10^{10}$ cm$^{-3}$ (equivalent to 2.8 mA/cm$^2$ in terms of ICF), as shown by a circle 210, a portion with the intense electric field appears gradually in the periphery part of the chamber evacuated to low pressure, and as shown by a circle 211, will get larger. This made the density increase in the periphery part (in the vicinity of the internal walls of the chamber) inside the chamber evacuated to low pressure 206, and spoiled uniformity.

SUMMARY OF THE INVENTION

The present invention has been completed based on recognition of the above described problems by the inventors.

An objective of the present invention is to introduce gases and electromagnetic waves into a chamber evacuated to low pressure to form plasma and alleviate change in a standing wave distribution in a plasma treatment apparatus for treatment of the object for processing.

Another objective of the present invention is to provide a plasma treatment apparatus that can give a stable and continuous plasma generation characteristic while maintaining uniformity of large diameter with a wide range of gas seeds, density and pressure.

Another objective of the present invention is to provide a method of manufacturing a semiconductor device that can be planned to improve throughput.

Among the various aspects of the invention disclosed in the present application, a summary of representative ones will now be given.

The plasma treatment apparatus of the present invention may comprise a chamber feasible to be evacuated to low pressure (chamber), a wafer stage for an object for processing located inside the above described chamber to be disposed thereon, an antenna as well as a dielectric window provided at a location facing the above described object for processing, a high-frequency power source with frequency=f to generate electromagnetic waves for making a predetermined gas to be introduced into the above described chamber into plasma, and a part for controlling a standing wave for making the standing wave electric field distribution provided in the vicinity of the periphery part of the above described dielectric window proper.

The basic construction of the part for controlling the standing wave is a ring structure with the portions other than the entrance thereof being surrounded by conductor and with a mode of a cavity having the final end being sealed with conductor, and inside the cavity is filled with any one of vacuum, air, or a dielectric with dielectric constant $\epsilon$.

In addition, with the radial depth of the chamber (the distance from the entrance to the internal end part of the conductor) d being set equivalent to $1/4+l/2\times(n-1)$: (n: positive integer, $l=c$(light velocity)$/f/\sqrt{\epsilon}$) in terms of characteristic length of the electromagnetic wave or in the vicinity thereof, the standing wave electric field distribution formed inside the dielectric window is made to reach a maximum (that is, a maximum amplitude position of the standing wave) in terms of radial position of an entrance of the standing wave controlling part. Incidentally, the radial position of an entrance of the standing wave controlling part refers to a position of the periphery end part of the dielectric window where the standing wave controlling part is mounted and a position equivalent to the internal wall surfaces of the chamber.

If quality constants of plasma for high frequency, which are described in technical literature on high-frequency plasma, for example, M. A. Lieberman and A. J. Lichtenberg: Principles of Plasma Discharges and Materials Processing, (John Wiley and Sons, Inc.) pp.93–96, pp. 108–110), are expressed by a dielectric constant, they will be expressed by a real number part giving a negative value and an imaginary number part expressing loss in the plasma. A negative dielectric constant means an inductive medium. According hereto, for example, with quality constants of plasma in, for example, a plasma of chloride of 0.4 Pa under plasma density being $2.8 \times 10^{10}$ cm$^{-3}$ (equivalent to 1.0 mA/cm$^2$ in terms of an incident ion current flux (ICF: Ion Current Flux)), $4.0 \times 10^{10}$ cm$^{-3}$ (equivalent to 1.4 mA/cm$^2$ in terms of ICF), and $8.0 \times 10^{10}$ cm$^{-3}$ (equivalent to 2.8 mA/cm$^2$ in terms of ICF), the dielectric constant of the plasma medium can be expressed as $\epsilon(2.8 \times 10^{10}$ cm$^{-3})=-10.1+j0.0816$, $\epsilon(4.0 \times 10^{10}$ cm$^{-3})=-14.9+j0.117$, and $\epsilon(8.0 \times 10^{10}$ cm$^{-3})=-30.8+j0.233$. With these, propagation of electromagnetic waves in a plasma can be analyzed. When an electromagnetic wave comes from a dielectric window into a plasma expressed by the above described quality constants, a change in medium serves to invert relationship between a maximum amplitude position of and a minimum amplitude position of the standing wave electric field distribution in a location equivalent to wall surfaces inside a chamber. Accordingly, distribution of the standing wave electric field formed in the plasma just below the dielectric window material will reach a minimum (that is, a minimum amplitude position of the standing wave) in a location equivalent to wall surfaces inside a chamber. If an entrance of the standing wave controlling part is narrow to a certain extent, plasma will not extend its influence. Therefore, the wavelength of standing wave electric field to be formed inside the standing wave controlling part will hardly be influenced by kinds of gases to be made into plasma and changes in density and pressure.

Accordingly, even if the quality constants of the plasma medium change, for a chamber comprising a standing wave controlling part regulated to have the above described depth, in the radial position that is the same as the inner diameter of the above described chamber evacuated to low pressure, the standing wave electric field distribution formed in the side of the plasma just below the above described dielectric window material will always be a minimum (that is, a minimum amplitude position of the standing wave). This can regulate the electric field in the vicinity of wall surfaces in the side of plasma just below the above described dielectric window material, and the power of the electromagnetic waves is introduced into an effective space region having a constant span with an expected destination above the wafer stage where an object for processing is always disposed.

That is, according to the present invention, the depth of the part for controlling the standing wave will become effective in the case of falling within the range of $d=l/4+l/2 \times (n-1) \pm l/8$ (n=positive integer l=c(light velocity)/f/$\sqrt{\epsilon}$). Accordingly, under a wide range of conditions, a plasma treatment apparatus that has high uniformity as well as linearity of plasma density for electromagnetic wave invested power and stable and continuous characteristic can be provided.

The part for controlling a standing wave of the present invention is filled with vacuum, air, or a dielectric almost lacking loss inside itself, and is to make the electric field in the vicinity of the internal walls of the chamber proper in terms of size and shape, and therefore will not give rise to bad influences such as loss of power and excess heating in that portion.

In addition, since provision outside the vacuum in the periphery part of the dielectric window is easily feasible, there is no necessity that a ring made of metal material be inserted inside the chamber evacuated to low pressure.

Moreover, the wavelength of the standing wave electric field formed inside the part for controlling the standing wave is approximately constant irrespective of conditions of plasma, and there is no need to change the structure mode from time to time during wafer processing with some moving mechanism.

BRIEF DESCRIPTION OF THE DRAWINGS

FIG. 2 is a schematic view of a plasma treatment apparatus related to Embodiment 2 of the present invention;

FIGS. 3A, 3B and 3C are schematic views showing an electric field distribution inside a chamber of a plasma treatment apparatus related to Embodiment 2 of the present invention;

FIGS. 4A, 4B and 4C are plasma characteristic graphs showing a comparison between a plasma treatment apparatus shown in FIG. 17 and a plasma treatment apparatus related to Embodiment 2 of the present invention;

DESCRIPTION OF THE SYMBOLS

Figure 1A:
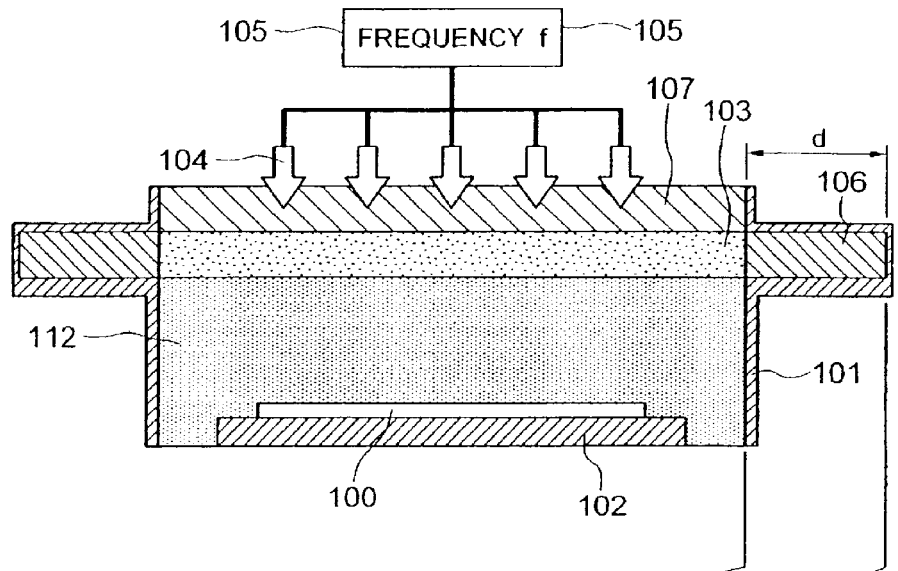
FIGS. 1A and 1B are schematic views of a plasma treatment apparatus related to Embodiment 1 of the present invention.

101 . . . Chamber evacuated to low pressure
102 . . . Wafer stage
103 . . . Dielectric window
104 . . . Electromagnetic wave
105 . . . High-frequency power source with frequency=f
106 . . . Part for controlling standing wave
107 . . . Region behind the dielectric window 108 . . . Entrance of the part for controlling standing wave
109 . . . Part for controlling standing wave
100 . . . Wafer
110 . . . Standing wave electric field distribution formed in the dielectric window material
111 . . . Maximum amplitude position of the standing wave
112 . . . Plasma
113 . . . Minimum amplitude position of the standing wave
201 . . . Wafer stage
202 . . . Quartz plate
203 . . . Quartz shower plate
204 . . . Vacuum seal material
205 . . . Plasma
206 . . . Chamber evacuated to low pressure
207 . . . Gap of air layer
208 . . . Antenna
209 . . . Antenna spacer
210 . . . Electric field (medium) in the periphery part of the chamber evacuated to low pressure
211 . . . Electric field (intense) in the periphery part of the chamber evacuated to low pressure
300 . . . Wafer
301 . . . Quartz plate
302 . . . Gap of air layer
303 . . . Plasma
304 . . . Vacuum seal material
305 . . . Chamber evacuated to low pressure
306 . . . Wafer stage
307 . . . Quartz shower plate
308 . . . Antenna
309 . . . Antenna spacer
310 . . . Electric field (weak) in the periphery part of the chamber evacuated to low pressure
311 . . . Electric field (weak) in the periphery part of the chamber evacuated to low pressure
401 . . . Uniformity of ICF in the case where a construction in FIG. 2 is used
402 . . . Uniformity of ICF in the case where a construction in FIG. 3 is used
403 . . . Electromagnetic wave power dependency of ICF in the case where constructions in FIG. 2, and FIG. 3 are used
404 . . . Electromagnetic wave power dependency of ICF in the case where a construction in FIG. 2 is used
405 . . . Electromagnetic wave power dependency of ICF in the case where a construction in FIG. 3 is used
501 . . . Part for controlling standing wave
502 . . . Chamber evacuated to low pressure
503 . . . Plasma
504 . . . Wafer stage
505 . . . Quartz plate
506 . . . Quartz shower plate
507 . . . Vacuum seal material
508 . . . Gap of air layer
509 . . . Antenna
510 . . . Antenna spacer
511 . . . Part for controlling standing wave
512 . . . Part for controlling standing wave
513 . . . Antenna spacer
601 . . . Part for controlling standing wave
602 . . . Quartz plate
603 . . . Chamber evacuated to low pressure
604 . . . Plasma
605 . . . Wafer stage
606 . . . Quartz shower plate
607 . . . Vacuum seal material
608 . . . Antenna
609 . . . Antenna spacer
610 . . . Gap of air layer
611 . . . Length of an L-shaped conductor part
612 . . . Dependency of ICF linearity for electromagnetic wave power toward length of an L-shaped conductor part
701 . . . Reactor for plasma etching
702 . . . High-frequency power source with f=450 MHz for plasma
703 . . . Tuner for plasma
704 . . . Solenoid coil for generating and controlling the magnetic field
705 . . . Base frame
706 . . . Wafer stage
707 . . . Wafer (300 mm$\phi$)
708 . . . Power source of f=400 kHz for wafer biasing
709 . . . Matching box for wafer biasing
710 . . . Reactor for plasma etching
711 . . . Reactor for plasma ashing
712 . . . Wafer cassette loading spot
713 . . . Wafer conveyor robot
801 . . . Etching rate uniformity in the case where a construction in FIG. 2 is used
802 . . . Etching rate uniformity in the case where a construction in FIG. 3 is used
803 . . . Etching rate uniformity under 360 W of electromagnetic wave power according to a construction in FIG. 2
804 . . . Etching rate uniformity under 720 W of electromagnetic wave power according to a construction in FIG. 2
805 . . . Etching rate uniformity under 360 W of electromagnetic wave power according to a construction in FIG. 3
806 . . . Etching rate uniformity under 720 W of electromagnetic wave power according to a construction in FIG. 3
900 . . . Wafer (300 mm$\phi$)
901 . . . Wafer stage
902 . . . Quartz plate
903 . . . Circular shower antenna
904 . . . Antenna spacer
905 . . . Part for controlling standing wave.

PREFERRED EMBODIMENTS OF THE INVENTION (Embodiment 1)

Embodiment 1 of the present invention will be described below with reference to FIG. 1 to FIG. 4.

FIG. 1A is a sectional view showing main parts of a plasma treatment apparatus in which a part for controlling a standing wave has been provided.

This plasma treatment apparatus consists of a chamber feasible to be evacuated to low pressure (chamber evacuated to low pressure) 101, a wafer stage 102 for an object for processing (semiconductor wafer 100) located inside the chamber 101, a disk-shaped dielectric window 103 facing the above described object for processing, a high-frequency power source 105 with frequency=f to generate electromagnetic waves 104 for making a predetermined gas to be introduced into the above described chamber into plasma, and a standing wave controlling part 106, for making the standing wave electric field distribution proper, mounted in the vicinity of the periphery part of the above described dielectric window. In addition, although FIG. 1 does not show, an antenna is located in a region 107 behind the dielectric window 103 so as to be sectioned from a plasma (plasma generating region) 112 of the internal part 112 of the chamber. For this antenna, antenna systems in variety of shapes and waveguide systems in variety of shapes are selected corresponding with necessity.

Figure 1B:
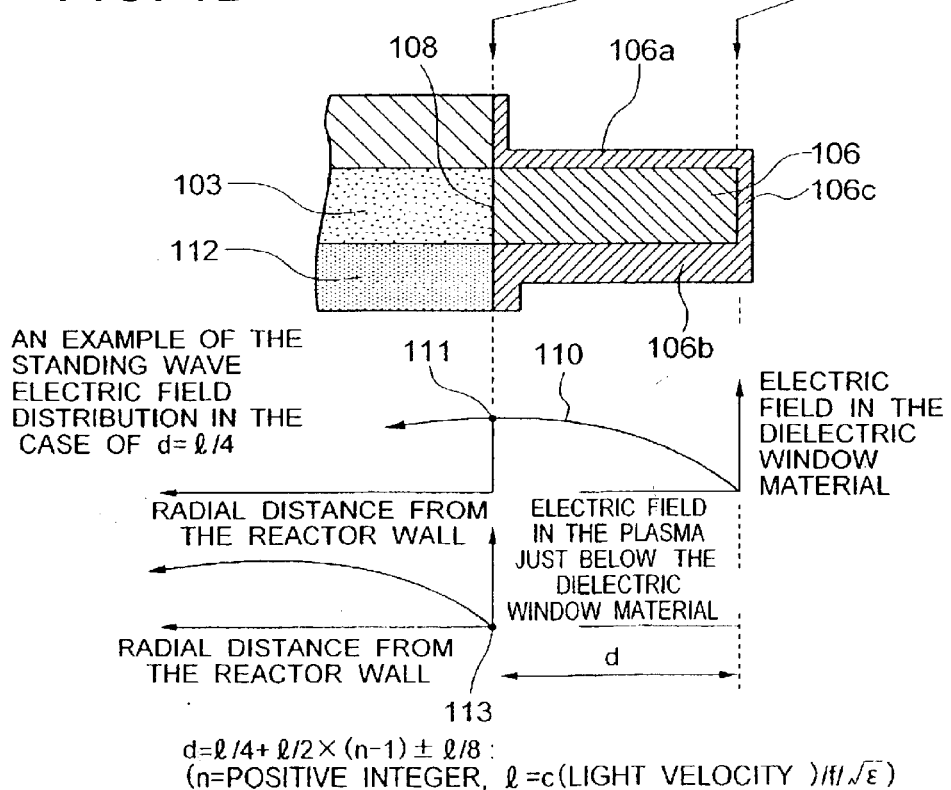

The standing wave controlling part 106 has, as shown in FIG. 1B, portions other than the entrance 108 brought into contact with the dielectric window 103 surrounded by a conductor. That is, the part 106 is constructed at the side wall of the dielectric window 103 to have a ceiling plate 106a, a bottom plate 106b, a side plate 106c closing the final ends of these plates 106a and 106b, and an entrance 108 located in the opposite direction from the side plate 106c and brought into contact with the dielectric window 103. An internal cavity of the part 106 partitioned by these plates 106a, 106b and 106c is filled with a vacuum, air or a dielectric with dielectric constant $\epsilon$. In addition, this standing wave controlling part 106 constitutes a ring structure surrounding a disk-shaped dielectric window 103. The cavity of part 106 is filled with any one of a vacuum, air or a dielectric of the dielectric constant $\epsilon$. Making the depth d of the cavity (distance from the entrance end 108 to the internal wall of the side plate 106c) equivalent to $1/4+1/2\times(n-1)$: (n=positive integer, $l=c$(light velocity)$/f/\sqrt{\epsilon}$) in terms of characteristic length of electromagnetic wave, at the location of entrance 108 of the standing wave controlling part (that is, in this basic construction, a location of the end of the periphery of the dielectric window where this part for controlling the standing wave is disposed, and a radial position equivalent to internal wall surfaces of the chamber evacuated to low pressure) the standing wave electric field distribution 110 formed inside the dielectric window will become maximum (that is, a maximum amplitude position of the standing wave 111).

As described above, if quality constants of plasma for high frequency, are expressed by a dielectric constant, they will be expressed by a real number part giving a negative value and an imaginary number part expressing loss in the plasma. A negative dielectric constant means an inductive medium. For example, with quality constants of plasma in, for example, a plasma of chloride of 0.4 Pa under plasma density being $2.8\times10^{10}$ cm$^{-3}$ (equivalent to 1.0 mA/cm$^2$ in terms of an incident ion current flux (ICF: Ion Current Flux)), $4.0\times10^{10}$ cm$^{-3}$ (equivalent to 1.4 mA/cm$^2$ in terms of ICF), and $8.0\times10$ cm$^{-3}$ (equivalent to 2.8 mA/cm$^2$ in terms of ICF), the dielectric constant of the plasma medium can be expressed as $\epsilon$ ($2.8\times10^{10}$ cm$^{-3}$)=$-10.1+j0.0816$, $\epsilon$ ($4.0\times10^{10}$ cm$^{-3}$)=$-14.9+j0.117$, and $\epsilon$ ($8.0\times10^1$ cm$^{-3}$)=$-30.8+j0.233$. With these, propagation of electromagnetic waves in a plasma can be analyzed. When an electromagnetic wave comes from a dielectric window 103 into a plasma 112 expressed by the above described quality constants, a change in medium serves to invert the relationship between a maximum amplitude position and a minimum amplitude position of the standing wave electric field distribution in a location equivalent to wall surfaces inside a chamber. Accordingly, the distribution of the standing wave electric field formed in the plasma just below the dielectric window material 103 will reach a minimum (that is, a minimum amplitude position of the standing wave 113) in a location equivalent to wall surfaces inside a chamber.

An entrance 108 of the standing wave controlling part 106 is made narrow so as not to be influenced by the plasma 112. Therefore, the wave-length of standing wave electric field to be formed inside the part for controlling the standing wave will become hardly influenced by kinds of gases to be made into plasma and changes in density and pressure. Therefore, even if the quality constants of the plasma medium change, for a chamber comprising a standing wave controlling part regulated to have the above described depth, in the position that is the same as the inner diameter of the above described chamber, the standing wave electric field distribution formed in the side of the plasma just below the above described dielectric window material will always be a minimum (that is, a minimum amplitude position 113 of the standing wave). This can regulate the electric field in the vicinity of wall surfaces in the side of plasma just below the above described dielectric window material, and the power of the electromagnetic waves is introduced into an effective space region having a constant span above the wafer stage 102 where an object for processing (semiconductor wafer) is always disposed. Thus, under a wide range of conditions, a plasma treatment apparatus that has high uniformity as well as linearity of plasma density for electromagnetic wave invested power and stable and continuous characteristic can be provided.

Incidentally, according to the present embodiment, the depth of the standing wave controlling part within the range of $\pm 1/8$ is effective, but if it departs therefrom, a plasma characteristic that does not provide good uniformity, as in the case where a standing wave controlling part is not provided, will be reinstated. Accordingly, the depth of the standing wave controlling part will become effective in the case of falling within the range of $d=1/4+1/2\times(n-1)\pm 1/8$ (n=positive integer, $l=c$(light velocity)$/f/\sqrt{\epsilon}$).

The standing wave controlling part of the present embodiment is filled with vacuum, air, and a dielectric almost lacking loss inside itself, and is to make the electric field in the vicinity of the internal walls of the chamber proper in terms of size and shape, and therefore will not give rise to bad influences such as loss of power and excess heating in that portion.

In addition, since provision outside the vacuum in the periphery part of the dielectric window is easily feasible, there is no necessity that a ring made of metal material be inserted inside the chamber evacuated to low pressure.

Moreover, the wavelength of the standing wave electric field formed inside the standing wave controlling part is approximately constant irrespective of conditions of plasma, and there is no need to change the structure mode during wafer processing with a certain moving mechanism.

(Embodiment 2)

Embodiment 2 of the present invention will be described below with reference to FIG. 2, FIGS. 3A, 3B and 3C.

The present Embodiment 2 is constructed to have as shown in FIG. 2 a standing wave controlling part in which a quartz plate 301 and a thin air layer (gap) 302 are extended for a portion equivalent to the characteristic length of the part 106 having been added in the above described Embodiment 1.

Figure 17:
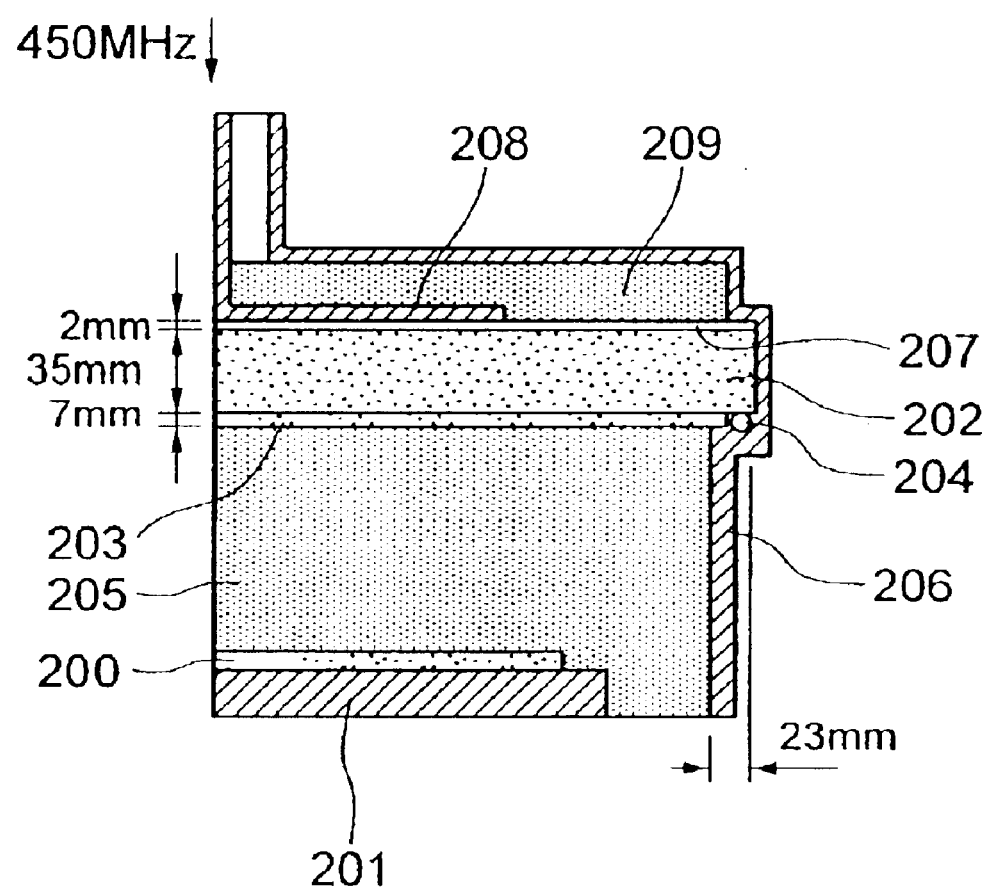
FIG. 17 is a schematic view showing a plasma treatment apparatus (etcher for gate processing) that the present inventors have considered prior to completion of the present invention.
Figure 18A:
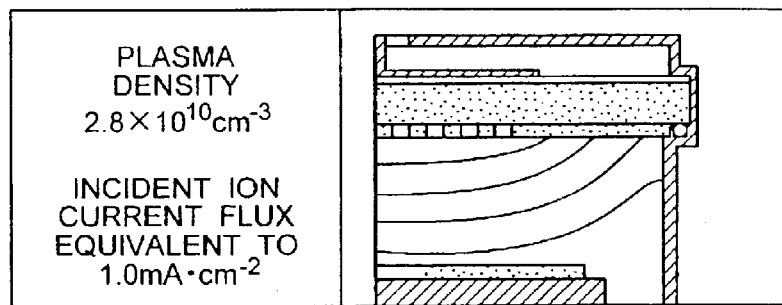
FIGS. 18A, 18B and 18C are schematic views showing electric field distributions inside a chamber of a plasma treatment apparatus having been shown in FIG. 17.
Figure 18B:
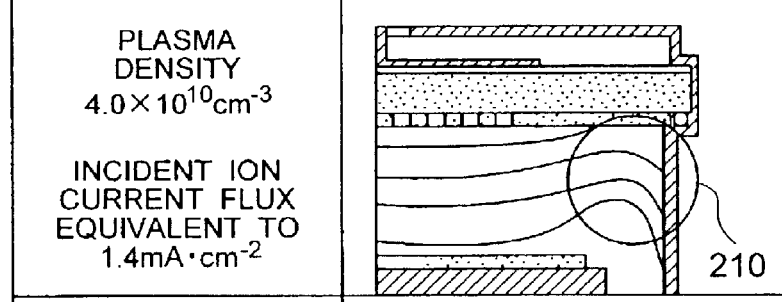
Figure 18C:
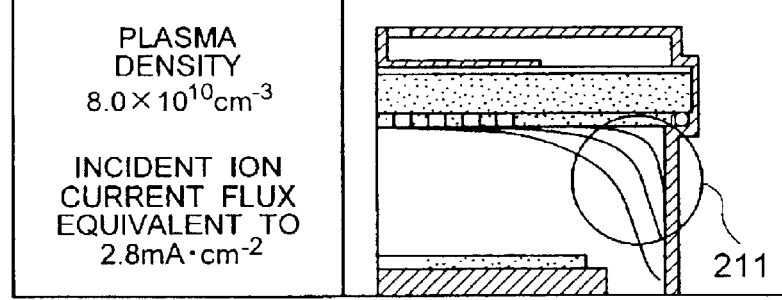

In the plasma treatment apparatus shown in FIG. 17, the designed size of balance between the radius of the quartz plate 202 and the inner diameter of the chamber was around 23 mm. On the other hand, in the present Embodiment 2, the designed size of balance between the radius of the quartz plate 301 and the inner diameter of the chamber 305 suitable for sealing the chamber 305 with a vacuum seal material 304 is larger than the designed size in FIG. 17. That is, the radius of the quartz plate 301 is designed to be larger than the inner diameter of the chamber 305 by approximately 108 mm. Incidentally, for a wafer stage 306, a quartz shower plate 307, an antenna 308 and an antenna spacer 309, those being same as those shown in FIG. 17 were used.

Generation of the plasma 303 according to this construction will be described below with reference to FIGS. 3A, 3B and 3C.

The above described designed size 108 mm falls within the range of the characteristic length of $d=1/4+1/2\times(n-1)\pm 1/8$: (n=positive integer, and here n=1, $l=c$(light velocity)$/f/\sqrt{\epsilon}$), being calculated on the assumption of substance (dielectric constant ϵ:around 3.3 to 3.6) with the dielectric constant being slightly lower than quartz (dielectric constant of 3.5 to 3.8), taking influence of a thin air layer gap 302 provided behind the quartz plate 301 into consideration as well. The calculated results of electric field distribution in this case are shown in FIGS. 3A, 3B and 3C. Increase in plasma density as in (a) $2.8\times10^{10}$ cm$^{-3}$, (b) $4.0\times10^{10}$ cm$^{-3}$ and (c) $80\times10^{10}$ cm$^{-3}$ does not present phenomena that the electric field increases in the vicinity of the internal walls of the chamber (the periphery part inside the chamber), as will be appreciated from the areas marked by circles 310 and 311. At this time, even if the power of a power source for generating electromagnetic waves to be introduced into chamber 305 is made to increase and the plasma density is made to increase, a space region where the power is introduced will not get biased to the periphery part, but under any power conditions, highly uniform ion currents are incident onto a wafer 300. In this construction, on the assumption that the gas seed or pressure is changed a lot, with the constant expressing the quality of the plasma medium being made to change further widely, no phenomena that electric field of the periphery part of the chamber continues to increase were observed.

Comparison between the plasma treatment apparatus shown in FIG. 17 and the construction of the present Embodiment 2 in terms of the plasma characteristics obtainable is shown in FIGS. 4A, 4B and 4C. FIG. 4A shows a plasma characteristic in the construction of the plasma treatment apparatus shown in FIG. 2. In addition, FIG. 4B shows a plasma characteristic in the construction of the present Embodiment 2. These plasma characteristics show uniformity of ICF in the case where chloride is used as gas and the pressure is set at 0.4 Pa. In addition, FIG. 4C is the plasma characteristic in relation to the electromagnetic wave power in the two apparatuses.

As for the plasma characteristic 401 of the plasma treatment apparatus shown in FIG. 17, as shown in FIG. 4A, when the electromagnetic wave power is increased from 360 W to 500W, the ICF distribution being approximately uniform with the center part being slightly higher changes into the ICF distribution with the periphery parts being slightly higher, and an increase to 1000 W has provided the ICF distribution with the periphery parts being even higher.

On the other hand, as for the plasma characteristic 402 of the present Embodiment 2, as shown in FIG. 4B, nearly flat ICF distribution is given for the range from 360 W to 1000 W, falling within a range of ±5% (3σ: σ is a standard deviation) as a result under all the power conditions. In addition, although it is not depicted, the construction of FIG. 17 could not maintain plasma in a stable fashion with 250 W or less. However, the present Embodiment 2 was found to be capable of maintaining plasma in a stable fashion with the power even lowered to reach 50 W.

In addition, in order to confirm linearity of ICF for powers in both apparatuses, a plasma characteristic 403 in which power is plotted on the horizontal axis and average value of ICF inside the 300 mmϕ plane of wafer is plotted on the vertical axis is shown in FIG. 4C.

For the plasma treatment apparatus shown in FIG. 17, the ICF (405) showed a tendency toward saturation with 500 W or more. On the other hand, in the present Embodiment 2, all the points up to 1000 W resulted in tracing an approximately straight line (404).

Incidentally, in order to confirm that the plasma characteristic of the construction according to the present Embodiment 2 (FIG. 2) in which the dielectric window of the quartz itself was extended outward is equivalent in principle to the one shown in the basic construction of FIG. 1, a part with the dielectric window 301 shown in FIG. 2 being split immediately outside a vacuum seal material 304 was produced and the experimental comparison was carried out, but the case involving split and the case involving no split have give rise to exactly the same characteristic.

In addition, it goes without saying that the effect in the present Embodiment 2 can be given likewise with a material having different dielectric constant such as alumina in instead of the dielectric window consisting of a quartz plate and a quartz shower plate. In addition, even if the shower plate is removed so that the method for introducing gas is changed, the essence of the invention will not be influenced at all, which is as described in Embodiment 1 with reference to FIG. 1.

(Embodiment 3)

As Embodiment 3 of the present invention, a variation of disposition of the standing wave controlling part will be described below with reference to FIG. 5.

Figure 5:
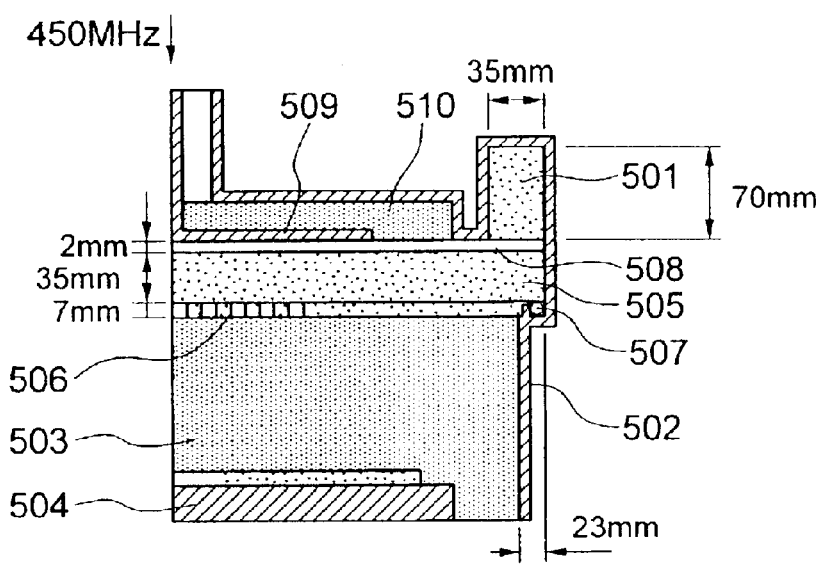
FIG. 5 is a schematic view of a plasma treatment apparatus related to Embodiment 3 of the present invention.

As shown in FIG. 5, above a quartz plate 505, a standing wave controlling part 501 of quartz (dielectric constant of 3.5 to 3.8) made by being brought into connection with that quartz plate is mounted. A wafer stage 504, the quartz plate 505 and the quartz shower plate 506 mounted in a position facing this, a vacuum seal material 507 as well as a thin air layer gap 508, and an antenna 509 mounted on the upper part thereof are exactly the same as those shown in FIG. 17. In addition, from necessity to provide the standing wave controlling part 501 upward, the antenna spacer 510 and the conductor member covering it from outside were designed to have a radius smaller by approximately 40 mm.

The size of the standing wave controlling part 501 with width of entrance being 35 mm was considered by calculation technique the same as that in the above described Embodiment 1. As a result thereof, with a construction comprising a quartz plate 505, a standing wave controlling part 501 and a thin air layer 508, the thin air layer 508 being sandwiched between the upper plane of the quartz plate 505 and the standing wave controlling part 501, if the height of the standing wave controlling part 501 is 70 mm, the calculation results of the standing wave electric field distribution with plasma density of $2.8\times10^{10}$ cm$^{-3}$ (equivalent to 1.0 mA/cm$^2$ in terms of ICF), $4.0\times10^{10}$ cm$^{-3}$ (equivalent to 1.4 mA/cm$^2$ in terms of ICF), and $8.0\times10^{10}$ cm$^{-3}$ (equivalent to 2.8 mA/cm$^2$ in terms of ICF) were found to correspond to the result (FIG. 3) given by the construction shown in FIG. 2. That is, as in the present Embodiment 3, also with a construction in which the direction is changed by 90 degrees, it became apparent that a shape and size to become equivalent as the characteristic length of electromagnetic wave could be determined. This advantageously allows for the design of an apparatus in which the protrusion in the horizontal direction avoids interfering with any other parts.

(Embodiment 4)

As Embodiment 4 of the present invention, another variation of disposition of the standing wave controlling part will be described below with reference to FIG. 6.

According to the present Embodiment 4, in order to plan further enhancement in compactness on shapes and sizes of a standing wave controlling part, alumina (with dielectric constant of 9.8) with higher dielectric constant was adopted as constructing material of the standing wave controlling part in the above described Embodiment 3. In addition, an optimum shapes and sizes were considered by a similar calculation technique.

Figure 6:
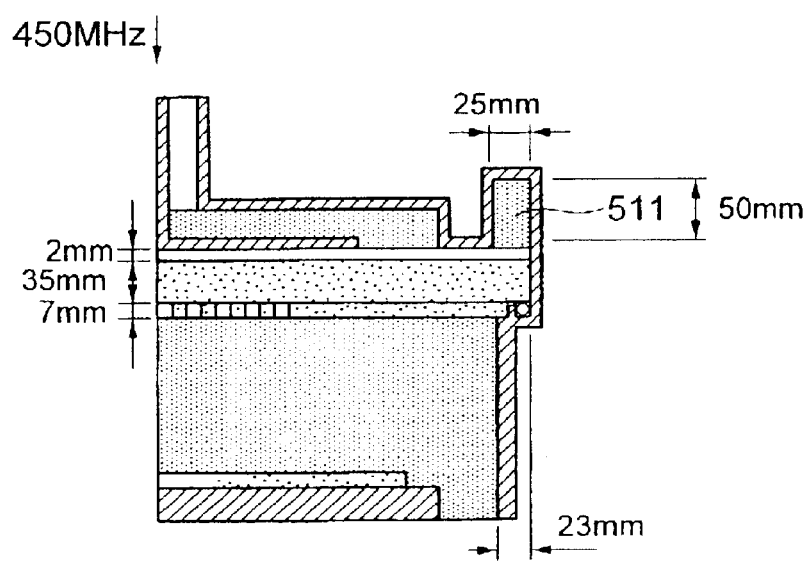
FIG. 6 is a schematic view of a plasma treatment apparatus related to Embodiment 4 of the present invention.

As shown in FIG. 6, the width of the entrance of the standing wave controlling part 511 was set to 25 mm and the other constructions were made same as that shown in FIG. 5.

According to the present Embodiment 4, in the case where the height of the standing wave controlling part was set to 50 mm, the calculation results of the standing wave electric field distribution with plasma density of $2.8 \times 10^{10}$ cm$^{-3}$ (equivalent to 1.0 mA/cm$^2$ in terms of ICF), $4.0 \times 10^{10}$ cm$^{-3}$ (equivalent to 1.4 mA/cm$^2$ in terms of ICF), $8.0 \times 10^{10}$ cm$^{-3}$ (equivalent to 2.8 mA/cm$^2$ in terms of ICF), plainly corresponded to the results given by Embodiment 2 (FIG. 3) and Embodiment 3 (FIG. 5). This can serve to plan further enhancement in compactness in shapes and sizes with making the dielectric constant of the material to fill out the standing wave controlling part higher.

As a dielectric to be used in the standing wave controlling part, quartz and alumina etc. are selected due to cost issues, but materials with further higher dielectric constant, for example, any one of zirconia (ZrO$_2$), titania (TiO$_2$), and YAG ceramics (Y$_3$Al$_5$O$_{12}$) may be used so that further enhancement in compactness becomes available.

(Embodiment 5)

Figure 7:
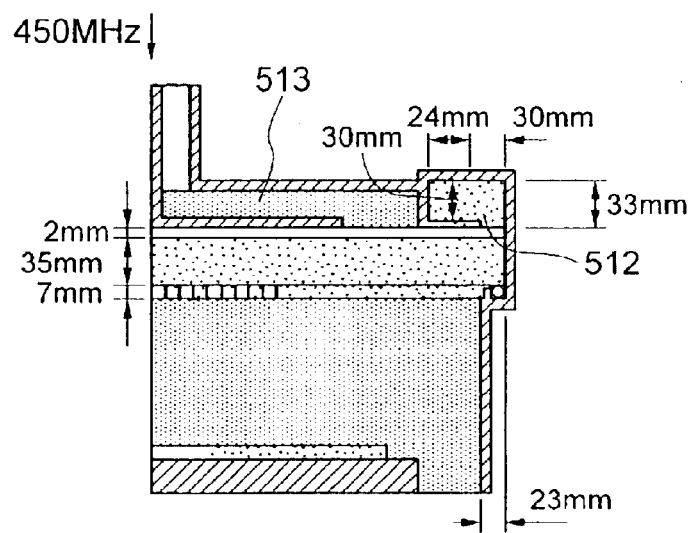
FIG. 7 is a schematic view of a plasma treatment apparatus related to Embodiment 5 of the present invention.

As Embodiment 5 of the present invention, a variation of disposition of the standing wave controlling part will be described below with reference to FIG. 7.

The present Embodiment 5 is structured to have the standing wave controlling part of Embodiment 4 that was further bent to constitute a right angle inward in order to plan further enhancement in compactness of the standing wave controlling part. As shown in FIG. 7, the standing wave controlling part 512 is filled with alumina inside and is shaped by being bent inward. In addition, the entrance width and the internal width are respectively 30 mm. For securing space, an antenna spacer 513 is made a little small, and the other constructions are the same as those of FIG. 5 and FIG. 6.

Consideration proceeded with a calculation technique similar to that in the above described Embodiment 2. As a result thereof, the calculation results of the standing wave electric field distribution with shapes and sizes shown in FIG. 5 and with plasma density of $2.8 \times 10^{10}$ cm$^{-3}$ (equivalent to 1.0 mA/cm$^2$ in terms of ICF), $4.0 \times 10^{10}$ cm$^{-3}$ (equivalent to 1.4 mA/cm$^2$ in terms of ICF), $8.0 \times 10^{10}$ cm$^{-3}$ (equivalent to 2.8 mA/cm$^2$ in terms of ICF), plainly corresponded to the results given by respective constructions of Embodiment 2 (FIG. 3), Embodiment 3 (FIG. 5) and Embodiment 4 (FIG. 6).

This made clear that the standing wave controlling part can be appropriately bent according to convenience of designing so that enhancement in compactness can be planned, and that the shape and sizes of the present Embodiment 5 are equivalent to Embodiment 2, Embodiment 3 and Embodiment 4 in terms of characteristic length of electromagnetic wave. As a result of consideration on the plasma characteristics respectively in Embodiment 3, Embodiment 4, and Embodiment 5 under the same experimental conditions as in Embodiment 2, well corresponding characteristics in terms of uniformity of ICF in each power of electromagnetic waves as shown in FIG. 4B and FIG. 4C and linearity of ICF relative to the power of the electromagnetic waves were confirmed.

In Embodiments 3, 4 and 5, variations in which the standing wave controlling part was mounted on the periphery part of the dielectric window or that was bent were respectively described, but with a construction that it is extended in the side direction and is bent downward in the atmosphere side, or the parts other than the entrance are surrounded by conductor in the downward vacuum side or with changes in thickness of curvature, adjustment in design of shape and size to make the characteristic length equivalent is possible.

(Embodiment 6)

Figure 8:
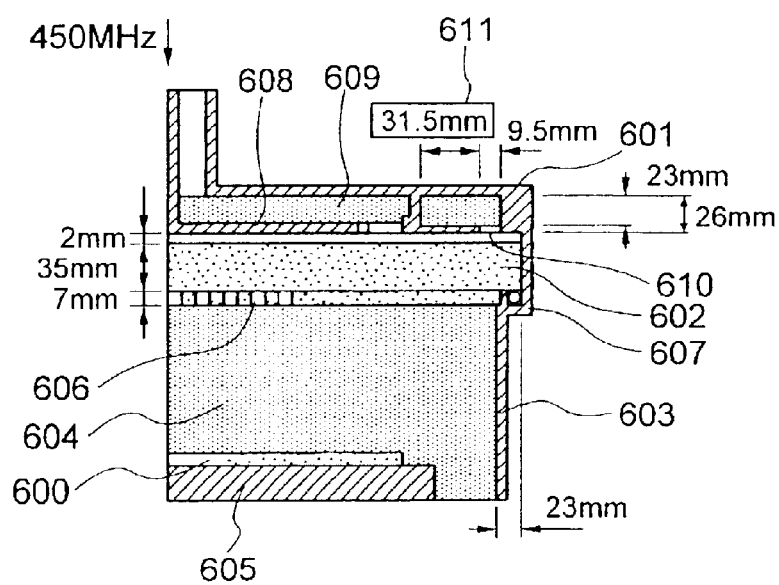
FIG. 8 is a partial schematic view of a plasma treatment apparatus related to Embodiment 6 of the present invention.

As Embodiment 6 of the present invention, another variation in disposition of the standing wave controlling part will be described below with reference to FIG. 8.

The present Embodiment 6 uses a construction of a standing wave controlling part that realized further enhancement in compactness. As shown in FIG. 6, the standing wave controlling part 601 is mounted in the location inward from the end part of a quartz plate 602. A wafer stage 605 that supports a wafer 600, a quartz plate 602 mounted on the location facing this, and a quartz shower plate 606, a vacuum seal material 607 and an antenna 608 mounted thereon are exactly the same as Embodiment 3 (FIG. 5).

The shape and size of the antenna spacer 609 was made to be slightly smaller than in FIG. 5 for convenience that the standing wave controlling part 601 is biased to inward. In addition, the shape of the thin air layer gap 610 also undergoes slight changes.

The entrance of the standing wave controlling part 601 is above the quartz plate 602, and is disposed 17 mm inward from the outside end part of the a quartz plate 602. In addition, thickness of alumina filling the standing wave controlling part 601 is made 7 mm thinner as compared with the construction shown in FIG. 5, and moreover the width of the entrance of the part for controlling standing wave is narrow with 9.5 mm. Due to such a design, the construction is made to house all in the same space as in the plasma treatment apparatus shown in FIG. 17.

With a calculation technique similar to that in Embodiment 2, the depth of the standing wave controlling part was considered. As a result thereof, with a design of depth shown in FIG. 6 and length 611 of an L-type conductor part surrounding the standing wave controlling part, the calculation results of standing wave electric field distribution with plasma density of $2.8 \times 10^{10}$ cm$^{-3}$ (equivalent to 1.0 mA/cm$^2$ in terms of ICF), $4.0 \times 10^{10}$ cm$^{-3}$ (equivalent to 1.4 mA/cm$^2$ in terms of ICF), and $8.0 \times 10^{10}$ cm$^{-3}$ (equivalent to 2.8 mA/cm$^2$ in terms of ICF) were found to correspond to the result given by Embodiment 2.

Strictly speaking, it appears that the present Embodiment 6 is constructed to involve two branched routes of electromagnetic wave that is reflected by the end part of the quartz dielectric window and returns and electromagnetic wave that enter the standing wave controlling part and reaches the innermost part and returns subject to reflection, but in the end, multiplexing them well, the effect similar to effects having been described so far can be given.

Thus, even with constructions involve branching of routes of electromagnetic wave, and bending direction or width of the entrance of the standing wave controlling part etc. that change in lapse of time, if only characteristic of electromagnetic wave is designed to be same, it became clearly possible to give effects equivalent to Embodiments 2, 3, 4 and 5.

Embodiment 6 is housed into the most compact design among embodiments that have been described so far. With the construction such as Embodiment 6 as a base, under central condition of size and shape shown in FIG. 8, experiments to cause the characteristic length of the standing wave controlling part to be changed were carried out. In the experiment, the length 611 of the L-type conductor part was changed so that the effective depth of the standing wave controlling part was, changed.

Figure 9:
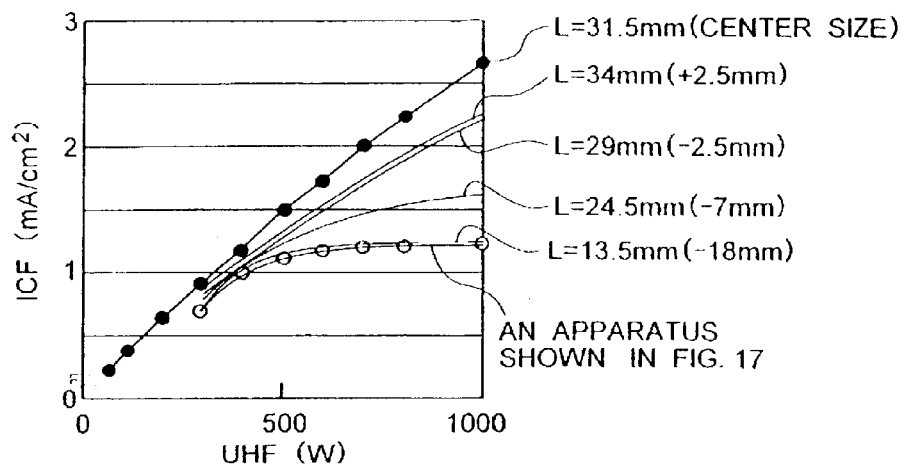
FIG. 9 is a plasma characteristic graph of a plasma treatment apparatus related to Embodiment 6 of the present invention.

As a result thereof, as shown in FIG. 9, whether the length of L part should be made longer or shorter than the center size (L=31.5 mm), the characteristics are deteriorated likewise. It is apparent that, for example, with a reduction of 18 mm, linearity of ICF relative to the power of electromagnetic wave is deteriorated to reach a level of characteristic similar to that in the case where the standing wave controlling part is not included. That is, the standing wave controlling part was found to extend effects within a range having a certain width from the center size of the length of the L part of the L-type conductor part (L-type metal fittings) 611. The electromagnetic wave at first propagates outward inside the dielectric window and returns at the tip part of the L part and enters the standing wave controlling part. Taking this into account, the change of 18 mm of L-part length can be said to be equivalent to change in propagation route of the electromagnetic wave for reciprocal routes of 18 mm. Estimating based thereon, the standing wave controlling part was found to extend its effects when it falls within a range of ±l/8 from the center size compared with a case where this is not used. In order to carry out reconfirmation with a simple experiment system, as a result of changing the radii within a range of ±l/8 in a construction in which the radii of the quartz plate and thin air layer gap are changed in FIG. 8, the effect of the present embodiment is provided within the range of ±l/8, but when deviating from it, deterioration is reconfirmed to take place, as in the characteristic without the standing wave controlling part.

Figure 10:
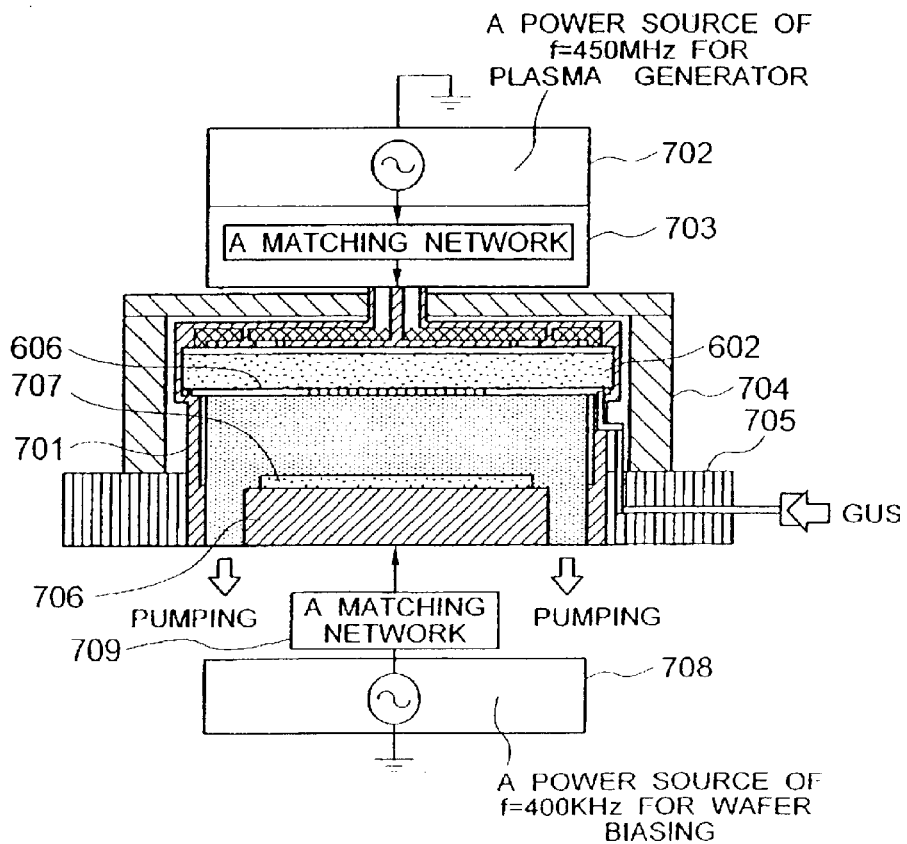
FIG. 10 is a schematic view showing an entire construction of a plasma treatment apparatus related to Embodiment 6 of the present invention.

FIG. 10 is a schematic view showing the whole construction of the plasma treatment apparatus (gate processing etcher or metal processing etcher) in the present Embodiment 6. Functions of this plasma treatment apparatus will be described below.

In FIG. 10, the electromagnetic waves generated in a high-frequency power source with f=450 MHz for plasma 702 are introduced into the reactor for plasma etching 701 via the tuner for plasma 703.

Plasma is made highly efficiently by applying the magnetic field generated by a solenoid coil for generating and controlling the magnetic field 704. A plasma etching reactor 701 and a solenoid coil for generating and controlling the magnetic field 704 are mounted on a base frame 705 having pumping equipment. A gas supply tube is buried as shown in the drawing in this base frame 705. The gas is introduced into the gap between the quartz plate 602 and the quartz shower plate 606, and introduced into the reactor 701 via a plurality of pores provided in the quartz shower plate. On the other hand, on the wafer stage 706 having ascending/descending mechanism, for example, a wafer 707 with diameter of 300 mm is loaded, and high-frequency wave generated by a power source of f=400 kHz for wafer biasing 708 is applied to that wafer 707 via a matching box for wafer biasing 709. And the surface of the wafer 707 undergoes etching treatment.

Figure 11:
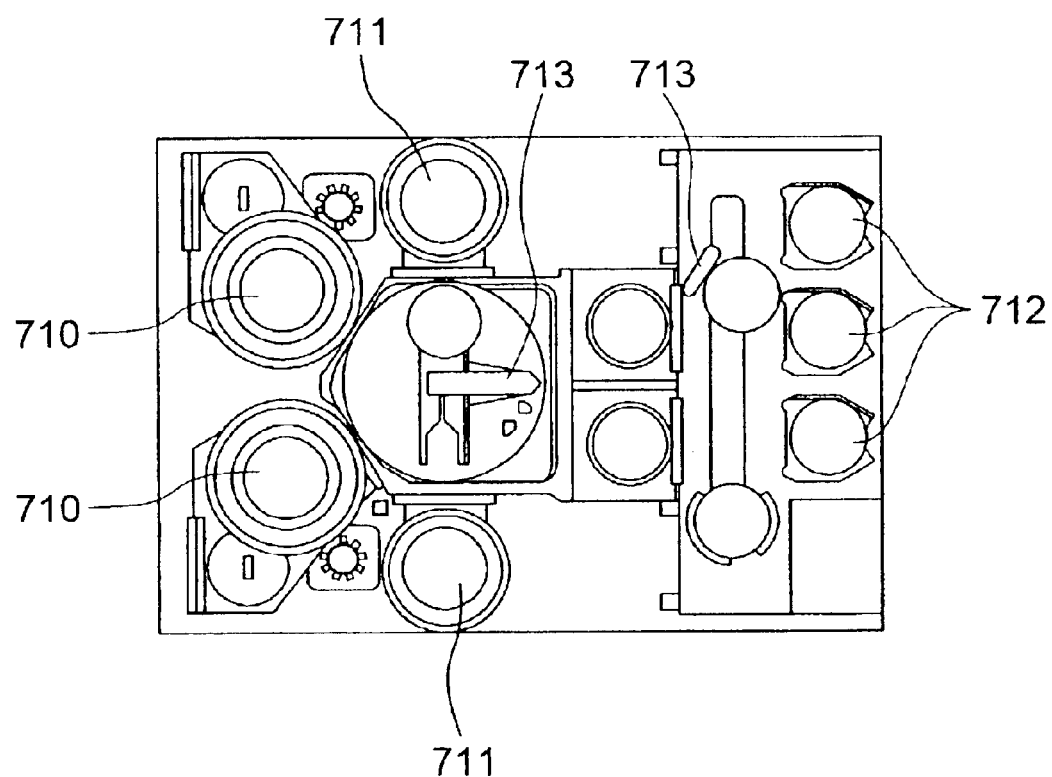
FIG. 11 is a plan view showing a base frame in its entirety related to Embodiment 6 of the present invention.

FIG. 11 is a plan view showing a base frame in its entirety. The plasma etching device 710 shown in FIG. 10 is mounted onto the base frame 705. The construction having two plasma etching devices 710 will enable parallel treatment with good efficiency in case of mass production. For the present Embodiment 6, one of these was used to assess etching. In addition, on the same base frame 705, two plasma ashing reactors 711 are mounted to constitute a construction enabling resist mask and removal of surface polymer subject to etching. In addition, in a wafer cassette loading spot 712, there is provided a waiting site for a wafer prior to etching and a waiting site for a wafer subject to etching, and the wafer is structured to be conveyed to respective places with a wafer conveyor robot 713.

That is, the basic construction of the embodiment shown in FIG. 11 has a plurality of reactors on the base frame, each of which reactors is characterized by comprising in a chamber feasible to be evacuated to low pressure a wafer stage for an object for processing to be disposed thereon, a dielectric window, that faces the above described object for processing, for introducing electromagnetic waves, a high-frequency power source with frequency=f to generate electromagnetic waves for making a predetermined gas to be introduced into the above described chamber evacuated to low pressure into plasma, and a standing wave controlling part provided in the vicinity of the periphery part of the above described dielectric window, filled with vacuum, air, or a dielectric with dielectric constant $\epsilon$, and with the portions other than the entrance thereof being surrounded by conductor, having depth thereof falling within the range of the characteristic length of $d=l/4+l/2\times(n-1)\pm l/8$: (n=positive integer, $l=c$(light velocity)/$f/\sqrt{\epsilon}$).

Figure 12A:
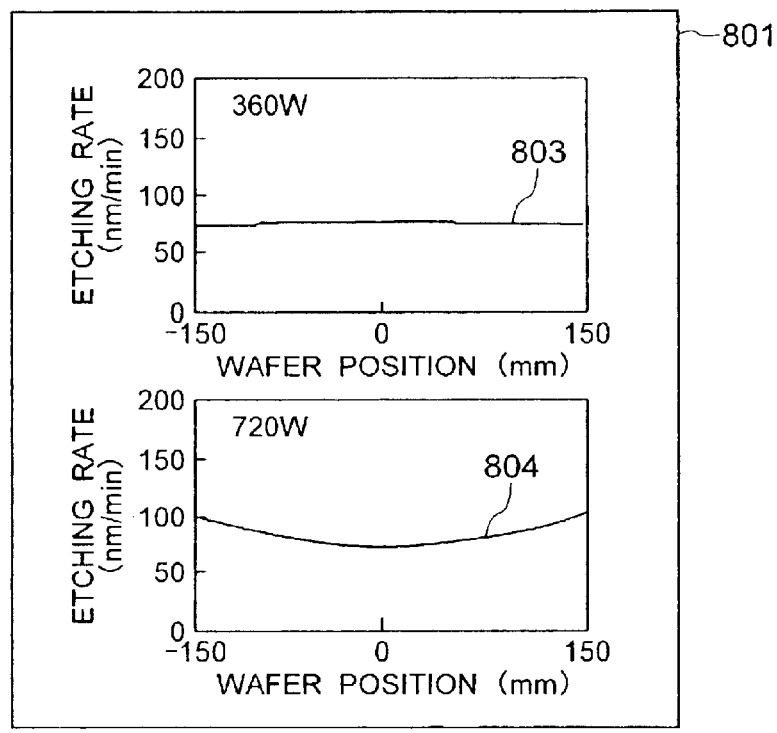
FIGS. 12A and 12B are plasma characteristic graphs showing a comparison between a plasma treatment apparatus shown in FIG. 17 and a plasma treatment apparatus related to Embodiment 6 of the present invention.
Figure 12B:
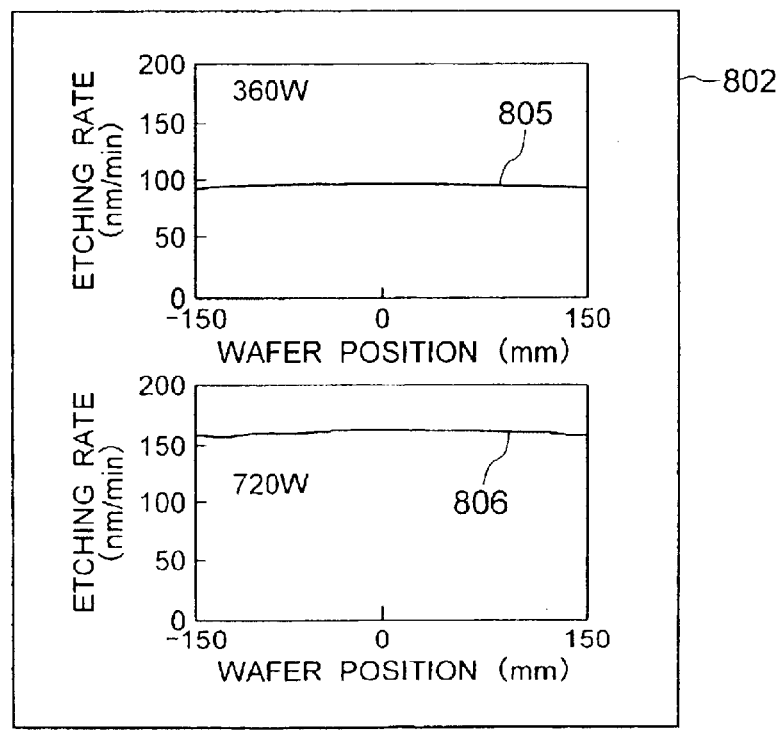

In FIG. 12A, plasma characteristic 801 related to uniformity in the plasma treatment apparatus in FIG. 17 is shown and in FIG. 12B, plasma characteristic 802 related to uniformity in the present Embodiment 6 is shown respectively. For respective apparatuses, chlorine is used as gas and the pressure is set at 0.4 Pa. In addition, uniformity in polysilicon etching in the case where 360 W and 720 W were used as the power of electromagnetic wave was assessed.

As shown in FIG. 12A, the plasma treatment apparatus of FIG. 17 deteriorates in its uniformity through transition from the characteristic 803 to the characteristic 804 with changing power of electromagnetic wave.

On the other hand, as shown in FIG. 12B, the present Embodiment 6 scarcely shows change in uniformity in the characteristic 805 and the characteristic 806 despite changes in power of electromagnetic wave. That is, according to the present Embodiment 6, uniformity was not deteriorated and good results were provided.

Incidentally, under similar conditions, uniformity of the same polysilicon was confirmed on Embodiments 2, 3, 4 and 5 respectively, and results well corresponding to the plasma characteristic shown in FIG. 12B were provided.

With the plasma treatment apparatus of the present Embodiment 6, uniformity of treatment performance on various steps and various film seeds in manufacturing course of LSI was confirmed. As an example, consistent treatment on etching related to gate forming with a single chamber was considered. As an experiment, etching treatment in the following manufacturing steps of LSI was carried out.

(a) BARC processing step of STI (Shallow Trench Isolation) pattern with $CF_4$ as a base: electromagnetic power 400 W.
(b) Top round processing step of STI with $CF_4$ as a base: electromagnetic power 350 W.
(c) Taper processing step of STI with HBr as a base: electromagnetic power 800 W.
(d) Bottom round processing step of STI with added gas: electromagnetic power 350 W.
(e) Step of trimming of gate mask pattern with $O_2$ and halogen mixed system: electromagnetic power 400 W.
(f) BARC processing step of gate pattern with $CF_4$ as a base: electromagnetic power 600 W.
(g) SiN mask processing step of gate pattern with $CF_4$ as a base: electromagnetic power 700 W.
(h) Perpendicular processing step polysilicon gate with $Cl_2$ as a base: electromagnetic power 450 W.
(i) Overetching step of polysilicon gate with HBr as a base: electromagnetic power 450 W.

For these steps of (a) to (i), uniformity on patternless wafers (300 mmφ) and uniformity on microprocessing in patterned wafers (300 mmφ) were confirmed.

As a result thereof, for all steps of (a) to (i), with patternless wafers, uniform treatment falling within a range of ±3% (3σ) was able to be confirmed, and with patterned wafers, etching processing including etching angle, roundness, residual amount of pattern mask etc. without shape differences and size differences between the center part and the periphery part within the wafer plane was able to be carried out with a single chamber evacuated to low pressure of the present invention. Compared with the case where a series of processing is carried out by dedicated apparatus of respective steps giving and taking wafers from an apparatus to an apparatus, or the case where it is carried out in an apparatus having a plurality of dedicated chambers evacuated to low pressure, extra time for conveying wafers into and out from respective dedicated apparatus or chambers evacuated to low pressure can be saved. In total, the time could be curtailed to not more than 50% and throughput was increased twice and more. Thus, construction with a single chamber evacuated to low pressure will make it possible to cope with various process conditions in wide ranges, and is ranked extremely high in terms of improvement in mass production efficiency. Those skilled in the art will readily appreciate that the system using the present invention can show uniform treatment performance under a wide range of conditions for other semiconductor treatment such as film forming CVD or sputtering etc. utilizing physical and chemical action of seeds created by plasma, and it works likewise in other various steps that coverage of a wide range of characteristics by a single plasma apparatus gives rise to an effect to improve production efficiency.

Incidentally, in the present Embodiment 6, application of magnetic field to the made plasma can not only enhance plasma making efficiency but also tune in uniformity of treatment inside the wafer surface exactly to a further higher extent.

In addition, the design of the chamber used in the present Embodiment 6 can be designed under any wavelength of electromagnetic waves in principle. For the design of an actual apparatus, there is a limit with which the-space should comply in the case where frequency is made low and wavelength is made long, but utilization of enhancement in heightening dielectric constant of material with which the standing wave controlling part is filled up inside and a structure involving multiple bending enabled design for low frequency to reach 10 MHz. On the other hand, as the frequency increases, the wavelength gets shorter, a tiny step structure of the chamber could make standing waves to exist locally, and thus, attention should be paid to the boundary shape of the chamber other than the standing wave controlling part. A design in which attention is paid to relief from corner to corner of the chamber can provide a design that can cope with high frequency to reach 3 GHz.

(Embodiment 7)

As Embodiment 7 of the present invention, a variation in disposition of the antenna will be described below with reference to FIG. 13 and FIG. 14.

The embodiments having been described so far are constructed to have an antenna mounted outside the dielectric window effective in particular for gate etching or metal etching.

However, the present invention introduces the waveguide for electromagnetic waves into the chamber by way of piercing through the dielectric window and is applicable to a construction having an antenna mounted inside the chamber as well. In particular, this construction is applied to etching of insulating film (oxide film etc.).

Figure 13:
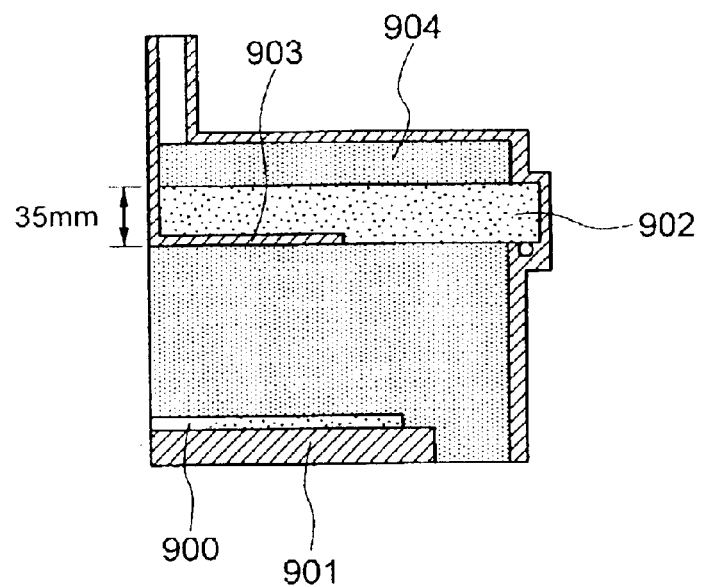
FIG. 13 is a schematic view showing a plasma treatment apparatus (insulating film etcher) that the present inventors have considered prior to completion of the present invention.
Figure 14:
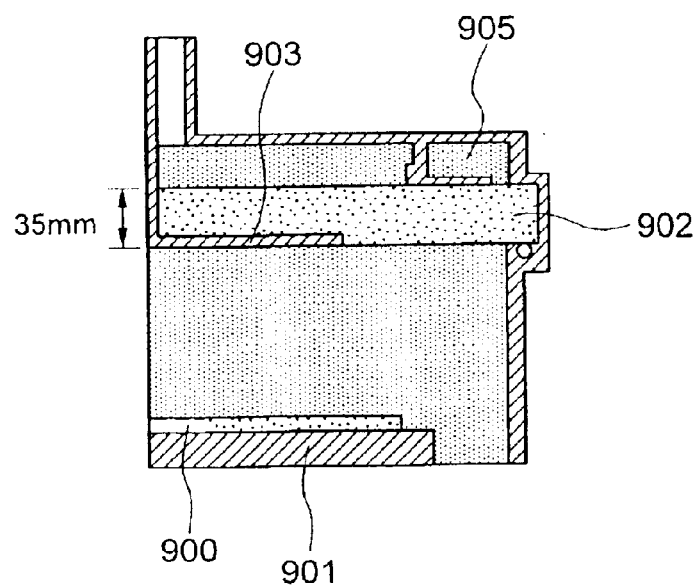
FIG. 14 is a schematic view showing a plasma treatment apparatus (insulating film etcher) related to Embodiment 7 of the present invention.

In order to confirm effects of a standing wave controlling part, a construction without a standing wave controlling part as shown in FIG. 13 and a construction (the present Embodiment 7) comprising a standing wave controlling part as shown in FIG. 14 were used for comparison and study on uniformity of ICF inside surface of a wafer (300 mmφ) and uniformity of etching.

At first, FIG. 13 shows a construction of a plasma treatment apparatus having an antenna spacer 904 without using the standing wave controlling part. For a wafer stage 901, the same specification as that for Embodiments so far was used and for a quartz plate 902, a waveguide for electromagnetic waves was caused to pierce through the center part. In addition, the quartz shower plate so far is taken off, and replacing it, a circular shower antenna 903 is fixed onto the quartz plate 902. In addition, a wafer 900 is mounted onto the wafer stage 901.

On the other hand, FIG. 14 shows a construction of a plasma treatment apparatus using a standing wave controlling part 905 approximately the same as the part described in Embodiment 6. For a wafer stage 901, the same specification as that for Embodiments so far was used and for a quartz plate 902, a waveguide for electromagnetic waves was caused to pierce through the center part. In addition, a circular shower antenna 903 is fixed onto the quartz plate 902. A wafer 900 is mounted onto the wafer stage 901.

At first, uniformity of ICF was considered. Under a condition involving an Ar base to which a small amount of CF system gas and $O_2$ gas were added, the cases of powers of electromagnetic wave being 400 W and 900 W were compared. As a result thereof, large difference was not observed between the two constructions with high power of electromagnetic wave being 900 W. But under condition of low power of electromagnetic wave being 400 W, for the construction without a standing wave controlling part, another plasma mode was given rise to with ICF to be caused to heighten locally only in the center part. In addition, as a result of investigation in detail, there was a mode transition point just around 500 W and in the vicinity thereof the plasma state became unstable. On the other hand, for the construction using the standing wave controlling part, also with 400 W, the ICF distribution similar to the case with 900 W was given in a stable fashion, and no unstable state was admitted around 500 W.

In the case where an antenna is mounted inside a chamber evacuated to low pressure, there are two kinds, that is, electromagnetic wave introduced into the plasma directly from the antenna and the component introduced into the plasma subject to propagation around the antenna and inside the dielectric window on the rear face thereof. The component introduced directly into the plasma from the former antenna is deemed to be introduced almost irrespective of the standing wave controlling part of the present invention, but as for the latter component that propagates in the horizontal direction inside the dielectric, the standing wave electric field distribution was made appropriate in the periphery thereof with the standing wave controlling, contributing to mode transfer and elimination of instability.

(Embodiment 8)

The L-type metal fitting having been described in Embodiment 6 is mounted in the atmosphere side and is in the ground potential, and therefore can be made a movable system easily. Metal contamination will not have to be of concern as in the case where a movable part is provided inside the chamber, and difficulty on designing will not be given rise to as in the case where an antenna directly to which an electromagnetic wave power is applied is made movable. In order to comply with mass production, it is desirable that such a mechanism that moves wafer one by one mechanically is avoided as much as possible, but the present invention shows an effect that can maintain uniformity under a wide range of process conditions also with structure being fixed, and therefore, it goes without saying that it operates movable mechanism on each process condition. However, in the case where wafers themselves are remarkably different, for example in the case where a wafer with special quality being not a silicon wafer undergoes etching, or in the case where reaction products are abundant, fine tuning of the movable part can execute adjustment to an extremely highly uniform treatment condition. In addition, being mounted in the atmosphere side, and being in ground potential, the movable parts will not be incapable of undergoing adjustment on each wafer according to need.

(Embodiment 9)

The basic construction of the plasma treatment apparatus having been described in Embodiment 6 consists of a chamber feasible to be evacuated to low pressure, a wafer stage for a wafer located inside the above described chamber to be mounted thereon, an antenna as well as a dielectric window provided in a location facing the above described wafer, a high-frequency power source with frequency=f to generate electromagnetic wave for making a predetermined gas to be introduced into the above described chamber into plasma, and a standing wave controlling part for making the standing wave electric field distribution provided in the vicinity of the periphery part of the above described dielectric window proper.

With this plasma treatment apparatus, a manufacturing method of a semiconductor device (for example, MOSLSI) will be described below with reference to FIG. 15 and FIG. 16.

Figure 15:
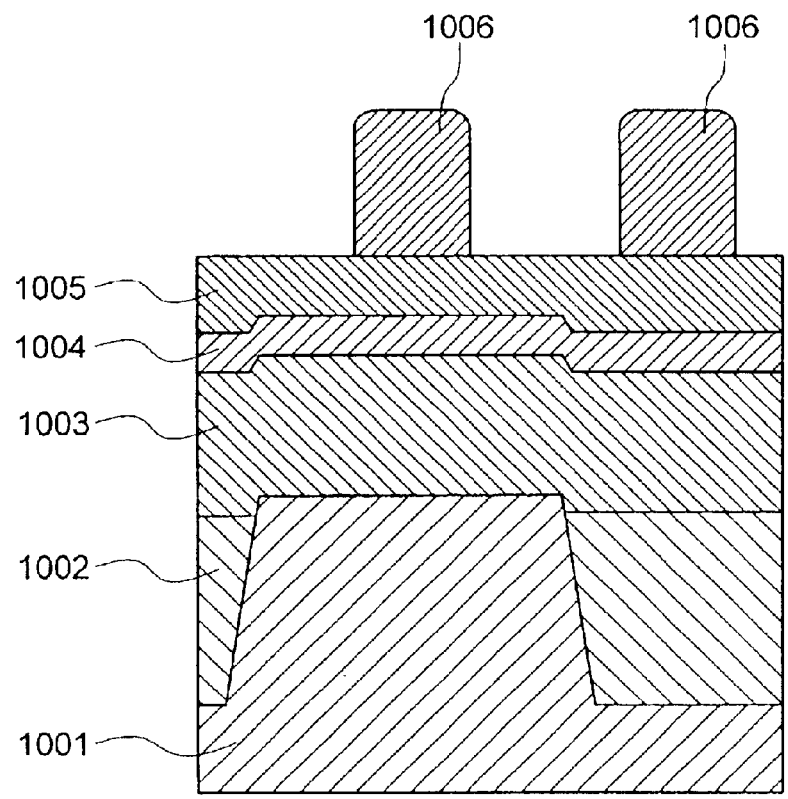
FIG. 15 is a sectional view showing a manufacturing process of a semiconductor device related to Embodiment 9 of the present invention.

(1) STI forming step:

In FIG. 15, at first with the above described plasma treatment apparatus, the main surface of a semiconductor substrate (wafer) 1001 is masked with an SiN film (not shown) and trenches are formed selectively. In addition, after formation of trenches, (b), (c) and (d) having been described in Embodiment 6 are executed. Subsequently, an insulating film ($SiO_2$) is deposited on the main surface of the wafer 1001 where trenches have been formed. Subsequently, the insulating film on the wafer main surface is polished by way of a chemical mechanical polishing method (CMP) so that a region of shallow trench isolation (STI) 1002 in which insulating film is embedded into trenches is formed.

(2) Step of forming a conductor film for MOS gate:

In FIG. 15, after gate oxide film (not shown) is formed on a plane surface of an element forming region surrounded by the region of shallow trench isolation (STI) 1002, the conductor film (first film) for MOS gate 1003 is formed. This conductor film for MOS gate 1003 is made of for example polysilicon or polymetal. Subsequently, onto this conductor film for MOS gate 1003, $SiO_2$ or SiN film is formed as a hard mask (second film) 1004. This hard mask is used for taking sufficient selection ratio at the time of gate processing. The present Embodiment 9 adopts an SiN film as the hard mask. Subsequently, an anti-reflective film (third film) 1005 called as BARC is formed onto this hard mask 1004. In addition, a photoresist mask 1006 is formed into a predetermined pattern onto the anti-reflective film 1005 by way of normally-applied photolithography technology. FIG. 15 is a sectional view when the photoresist mask 1006 was formed into a pattern.

Figure 16:
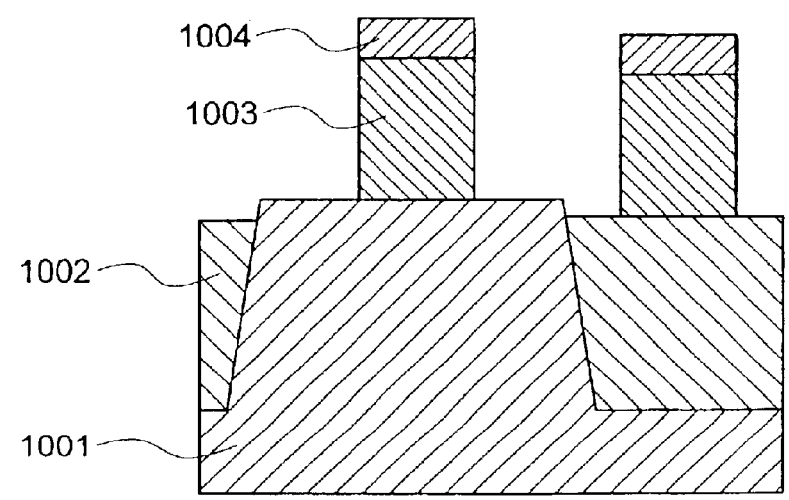
FIG. 16 is a sectional view showing a manufacturing process of a semiconductor device related to Embodiment 9 of the present invention.

Step of processing conductor film for MOS gate:

In FIG. 15 and FIG. 16, the above described mask pattern 1006 is copied onto the above described anti-reflective film 1005, the hard mask 1004 and the conductor film for MOS gate 1003 respectively subject to dry etching processing on the above described anti-reflective film 1005, the hard mask 1004 and the conductor film for MOS gate 1003 sequentially with the above described plasma treatment apparatus. At this time, subject to selective etching on the above described anti-reflective film 1005 and the hard mask 1004 with the mask pattern 1006, the resist mask 1004 as well as the anti-reflective film 1005 are removed so that a pattern for the conductor film for MOS gate 1003 is formed with the hard mask 1004. In this step, (e) to (i) having been described in Embodiment 6 are carried out.

Hereafter, a source as well as a drain with the gate (electrode) 1003 as a mask will be formed. In addition, moreover, on the sidewall of the gate (electrode) 1003, a sidewall (SiN) spacer will be formed. The above described plasma treatment apparatus is also applied to anisotrpic etching at the time when this sidewall spacer is formed.

After all, according to the present Embodiment, use of plasma treatment apparatus for general purpose enables a plan of improvement in throughput as well as improvement in yield.

According to a plasma treatment apparatus using high frequency of the present invention, a standing wave controlling part is provided in a location in the vicinity of the periphery part of a dielectric window, and the standing wave electric field distribution created inside the dielectric window material is made appropriate when electromagnetic waves are introduced into a chamber evacuated to low pressure from the dielectric window. This can serve to process a sample uniformly under conditions of a wide range of gas seeds, pressure and density. In addition, applying a single chamber evacuated to low pressure to a number of steps under a wide range of conditions in a consistent fashion, a plasma treatment apparatus with high production efficiency can be provided.

In addition, applying the plasma treatment apparatus in which high frequency of the present invention was used to a step of manufacturing an LSI, uniform microprocessing is carried out inside a wafer surface and an LSI with high yield can be achieved.

What is claimed is:

1. A plasma treatment apparatus comprising a chamber to be evacuated to low pressure, a wafer stage disposed in said chamber for an object for processing to be disposed thereon, a dielectric window, that faces said object for processing, for introducing electromagnetic waves, a high-frequency power source with frequency=f to generate electromagnetic wave power for making a predetermined gas to be introduced into said chamber evacuated to low pressure into plasma, and a part constructed to control a standing wave, said standing wave controlling part having an entrance provided at an upper edge section of said dielectric window, said standing wave controlling part being filled with vacuum, air, or a dielectric with dielectric constant $\epsilon$, having portions other than the entrance thereof being surrounded by conductor, and having a depth thereof falling within a range of a characteristic length of $d=l/4+l/2\times(n-1)\pm l/8$: (n=positive integer, l=c(light velocity)/f/$\sqrt{\epsilon}$).

2. The plasma treatment apparatus according to claim 1, wherein intensity of a standing wave electric field formed inside said dielectric window reaches a maximum in a same radial location as an inner diameter of said chamber.

3. The plasma treatment apparatus according to claim 1, wherein intensity of a standing wave electric field formed in a side of the plasma just below said dielectric window material reaches a minimum in a same radial location as an inner diameter of said chamber.

4. The plasma treatment apparatus according to claim 1, comprising an antenna made of conductor or semiconductor in an atmosphere side or a vacuum side of said dielectric window.

5. The plasma treatment apparatus according to claim 1, comprising a mechanism capable of changing sizes of said standing wave controlling part.

6. The plasma treatment apparatus according to claim 1, wherein a dielectric used inside said dielectric window as well as said standing wave controlling part is constituted by any of alumina ($Al_2O_3$) and quartz ($SiO_2$) or by a combination thereof.

7. The plasma treatment apparatus according to claim 1 having a plurality of reactors on a base frame, wherein each of which reactors comprises a chamber to be evacuated to low pressure, a wafer stage disposed in the chamber for an object for processing to be disposed thereon, a dielectric window, that faces said object for processing, for introducing electromagnetic waves, a high-frequency power source with frequency=f to generate electromagnetic wave power for making a predetermined gas to be introduced into said chamber evacuated to low pressure into plasma, and a part constructed to control a standing wave, said standing wave controlling part having an entrance provided at an upper edge section of said dielectric window, the standing wave controlling part being filled with vacuum, air, or a dielectric with dielectric constant $\epsilon$, having portions other than the entrance thereof being surrounded by conductor, and having a depth thereof falling within a range of a characteristic length of $d=/4+l/2\times(n-1)\pm l/8$: (n=positive integer, l=c(light velocity)/f/$\sqrt{\epsilon}$).

* * * * *